United States Patent [19]

McCallister et al.

[11] Patent Number: 4,500,994
[45] Date of Patent: Feb. 19, 1985

[54] MULTI-RATE BRANCH METRIC PROCESSOR FOR MAXIMUM-LIKELIHOOD CONVOLUTIONAL DECODER

[75] Inventors: Ronald D. McCallister, Scottsdale; James J. Crawford, Tempe, both of Ariz.

[73] Assignee: Motorola, Inc., Schaumberg, Ill.

[21] Appl. No.: 432,489

[22] Filed: Oct. 4, 1982

[51] Int. Cl.³ ............................................. G06F 11/12
[52] U.S. Cl. ...................................................... 371/43
[58] Field of Search ........................ 371/30, 37, 43, 44

[56] References Cited

U.S. PATENT DOCUMENTS

| | | | |
|---|---|---|---|
| 4,038,636 | 7/1977 | Doland | 371/37 |
| 4,130,818 | 12/1978 | Snyder, Jr. | 371/43 |
| 4,240,156 | 12/1980 | Doland | 371/43 |

OTHER PUBLICATIONS

Peterson and Weldon, *Error-Correcting Codes*, second edition. The MIT Press, 1972, pp. 392-425.
Forney, "The Veterbi Algorithn", Proc. IEEE, vol. 61, pp. 268-278, Mar. 1973.

*Primary Examiner*—Jerry Smith
*Assistant Examiner*—M. Ungerman
*Attorney, Agent, or Firm*—Jonathan P. Meyer

[57] ABSTRACT

A branch metric processor for use in a maximum-likelihood convolutional decoder accepts a set of soft-decision symbols, an indicator of a level of quantization thereof and a set of erase control signals and generates branch metrics for base code rates of $\frac{1}{3}$ and $\frac{1}{2}$. The apparatus represents a substantial reduction in complexity over prior art devices. Erasure of selected symbols allows the processor to generate branch metrics for higher code rates and is advantageous in very low code rate applications.

8 Claims, 3 Drawing Figures

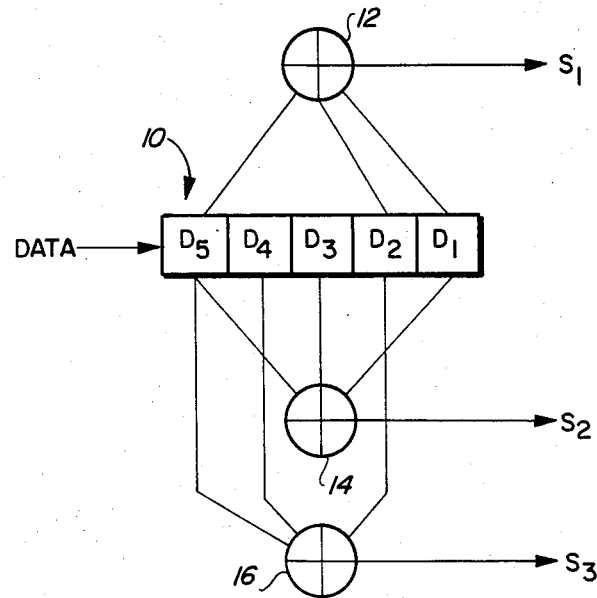
_Fig-1_
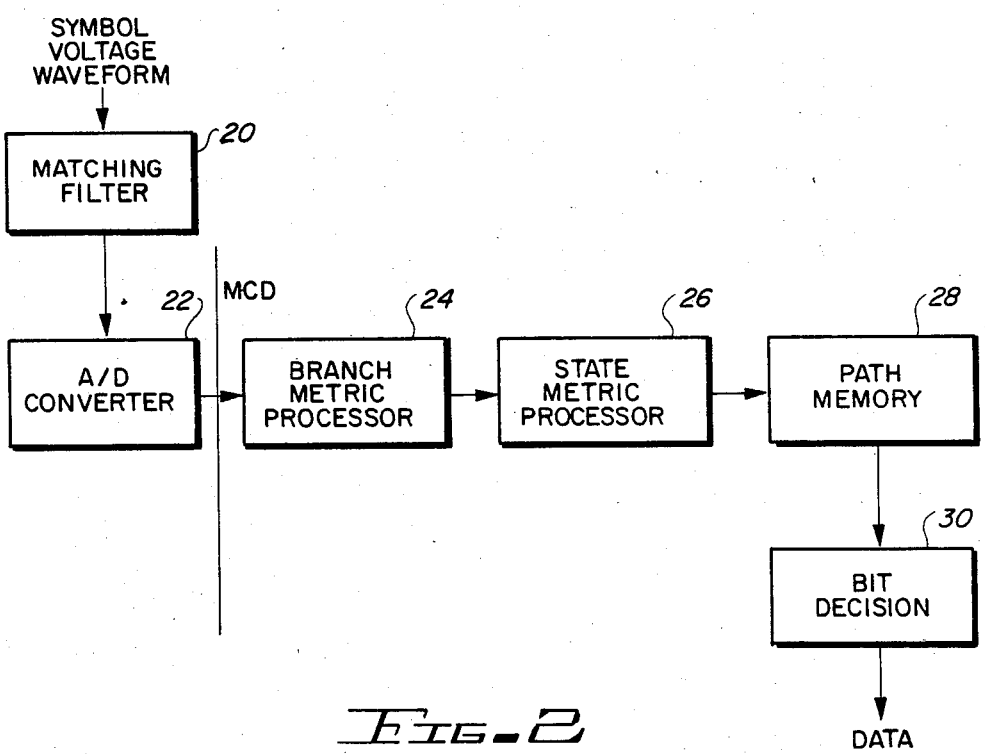
_Fig-2_

4,500,994

MULTI-RATE BRANCH METRIC PROCESSOR FOR MAXIMUM-LIKELIHOOD CONVOLUTIONAL DECODER

FIELD OF THE INVENTION

The present invention relates, in general, to convolutional decoders utilizing the maximum-likelihood, or Viterbi, algorithm. More particularly, the invention relates to a reduced complexity branch metric processor which is adaptable to different levels of quantization and different code rates for a given code and constraint length.

BACKGROUND OF THE INVENTION

Convolutional coding is a technique for error correction in a digital data link and is applicable to a wide range of digital data communication systems. While the encoding processor for convolutional coding is very simple, the processors needed for decoding are generally complex. A popular algorithm for decoding convolutionally coded data has been widely known for some time (see G. D. Forney, Jr., "The Viterbi Algorithm", Proc. IEEE, Vol. 61, pages 268-278, March 1973), but has required specialized processing hardware for each of the possible levels of quantization and code rates which may be used. Since bandwidth limited communication channels which are commonn in commercial applications require high code rates and deep space or anti-jamming applications demand low code rates, it would be desirable to have available a single processor capable of producing the branch metrics necessary for maximum-likelihood convolutional decoding at a number of different quantization levels and code rates while being economically implementable in LSI form.

SUMMARY OF THE INVENTION

Accordingly, it is an object of the present invention to provide an improved branch metric processor for maximum-likelihood convolutional decoding.

It is a further object of the present invention to provide a reduced complexity branch metric processor for multi-rate, maximum-likelihood convolutional decoding.

A particular embodiment of the present invention comprises a branch metric processor which accepts a set of three soft-decision symbols at quantization levels of 2, 4 or 8 and computes the proper branch metrics for base code rates of $\frac{1}{3}$ and $\frac{1}{2}$. Furthermore, the processor has the capability of erasing any combination of one or more of the received symbols, which effectively allows the processor to compute branch metrics for higher code rates. The capability of erasure is also useful if a particular symbol is rendered meaningless by a noise spike or jamming, since that symbol may be readily prevented from entering the decoding process. The implementation of the processor represents significantly reduced complexity over prior art branch metric processors, thus allowing reduced die size and corresponding increase yield in LSI form.

BRIEF DESCRIPTION OF THE DRAWINGS

FIG. 1 is a schematic diagram of a convolutional coding circuit having a constraint length of 5 and a code rate of $\frac{1}{3}$.

FIG. 2 is functional block diagram of a maximum-likelihood convolutional decoder (MCD).

DETAILED DESCRIPTION OF THE INVENTION

Figure 3:
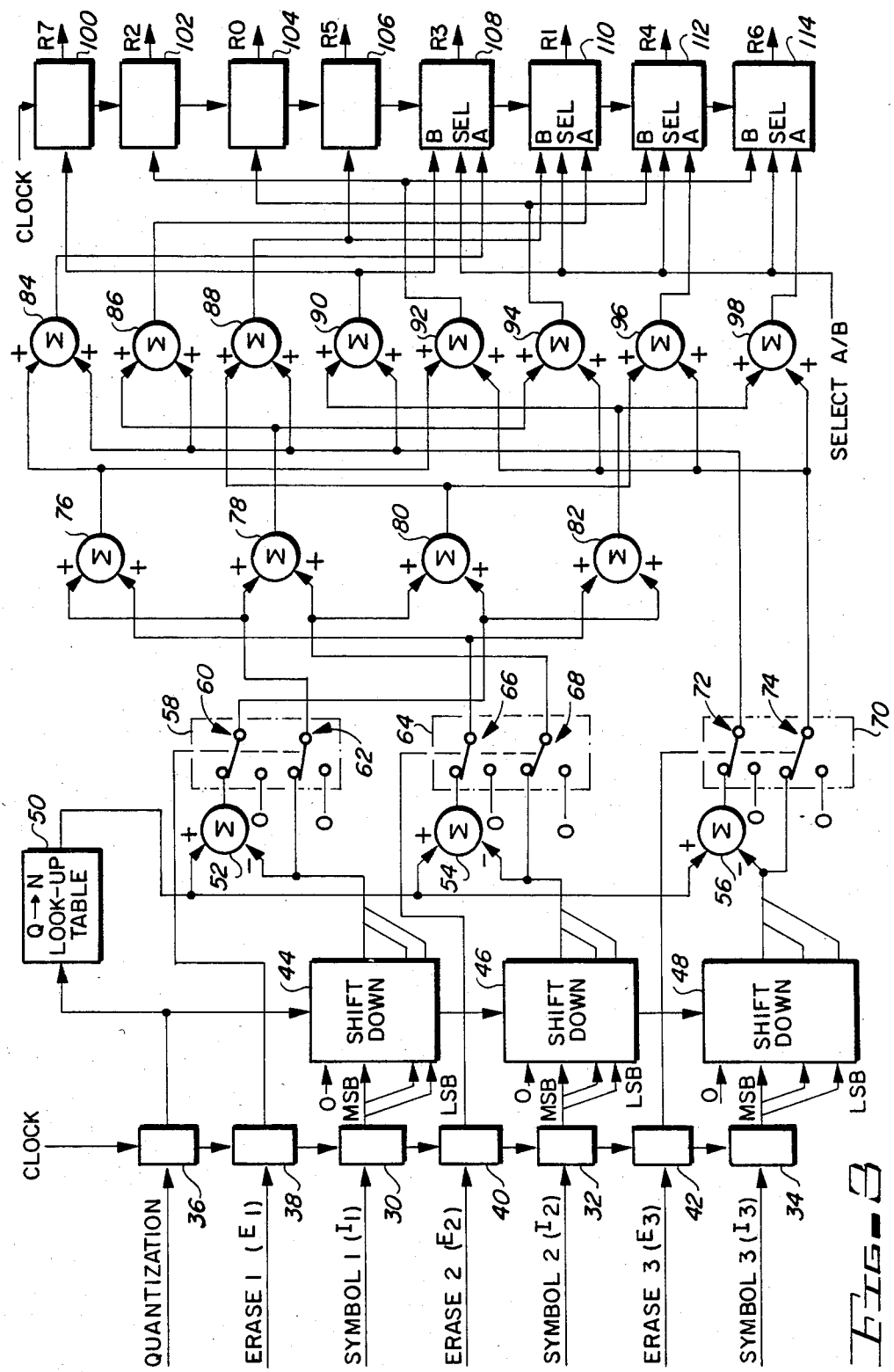
FIG. 3 is a functional block diagram of a multi-rate branch metric processor according to the principles of the present invention.

Convolutional coding is a well known technique for error correction in digital data transmission systems. FIG. 1 is a diagram of a typical convolutional encoder which is used at the transmitting end of a digital data link. A digital data register 10 comprises five data cells $D_1$, $D_2$, $D_3$, $D_4$ and $D_5$. Digital data bits are input first to cell $D_5$ and are shifted through each of the data cells in descending order. Each time a new bit is shifted into cell $D_5$ a set of three symbols $S_1$, $S_2$ and $S_3$ are generated. A first exclusive OR circuit 12 has inputs coupled to data cells $D_5$, $D_2$ and $D_1$ and produces symbol $S_1$. A second exclusive OR circuit 14 has inputs coupled to data cells $D_5$, $D_3$ and $D_1$ and produces symbol $S_2$. A third exclusive OR circuit 16 has inputs coupled to data cells $D_5$, $D_4$ and $D_2$ and produces symbol $S_3$. Each of the symbols $S_1$ through $S_3$ is a single bit representing the result of the exclusive OR operation performed on three of the data bits in register 10. The symbols are then transmitted to the receiving station instead of the data bits which are intended to be communicated.

The encoding circuit of FIG. 1 produces three symbols for each data bit to be communicated and is therefore a rate $\frac{1}{3}$ convolutional encoder. Similarly, if two symbols were generated for each data bit the circuit would be a rate $\frac{1}{2}$ convolutional encoder. The encoder of FIG. 1 is said to have a constraint length of five because register 10 comprises five data cells. The choices of the code rate, the constraint length and the particular interconnections between the exclusive OR circuits and the data cells determine the characteristics of the resulting convolutional code, as is familiar in the art.

A very low code rate, for instance 1/10, may be highly desirable for deep space and/or anti-jamming applications due to the high degree of redundancy in the transmitted data. But such a code rate demands a very high bandwidth data link due to the large number of symbols which must be transmitted to communicate a single bit of data. Commercial applications which commonly use much higher code rates, for instance 4/5, to accommodate bandwidth limited channels are also familiar in the art. These varied applications of convolutional coding give rise to the need for a convolutional decoding circuit which can adapt to various code rates.

Referring now to FIG. 2 a functional block diagram of a maximum-likelihood convolutional decoder (MCD) is shown. After demodulation of the RF signal at the receiving station the transmitted symbols appear as a symbol voltage waveform which comprises the voltage levels indicating a string of logical 1's and 0's and all of the noise introduced during the transmission. A matching filter 20 is used to improve the waveform somewhat, but the decision of whether a logical 1 or 0 was sent during a given time period is still difficult to make. An A-to-D converter 22 coupled to matching filter 20 is used to generate a one, two or three bit data word in response to the received waveform. The voltage interval representing the difference between a logical 1 and a logical 0, say +1 volt to −1 volt, is divided into two, four or eight subintervals and a data word assigned depending upon which subinterval includes the received voltage value. The resulting data words are referred to as soft-decision symbols and the number of subintervals is referred to as the level of quantization thereof.

The soft-decision symbols are input to the MCD in an ensemble comprising all of the symbols generated at a single operation of the encoder. For instance, in a rate ⅓ system, three soft-decision symbols are input to the MCD as an ensemble. A branch metric processor 24 operates on the received symbols and produces a set of branch metrics. In essence, the branch metrics represent a set of hypotheses. Each hypothesis corresponds to a particular sequence of logic levels and each branch metric represents the relative likelihood of that hypothesis being true. For instance, in a rate ⅓ system, three soft-decision symbols are received resulting in eight possible sequences of logic levels (000, 001, 010, 011, etc.) and eight branch metrics corresponding to the relative likelihood of each sequence. The branch metrics are input to a state metric processor 26 which forms a set of hypotheses corresponding to the likelihood of the various possible sequences of data bits which could have generated the received symbols. State metric processor 26 utilizes path memory 28 to keep track of the various hypotheses and a bit decision circuit 30 finally reconstructs the digital data stream which was input to the convolutional encoder at the transmitting end.

Prior art maximum likelihood convolutional decoders were specially designed not only for the particular code and constraint length used in the encoder, but also for the code rate and level of quantization. The branch metric processor, in particular, was highly specialized and complex. Referring now to FIG. 3, a branch metric processor according to the present invention is shown which can generate branch metrics corresponding to base code rates of ½ and ⅓ from symbols with quantization levels of 2, 4 or 8 and can erase certain of the symbols to obtain other code rates. The reduced complexity of the branch metric processor according to the principles of the present invention allows reduced power and weight in discrete implementations and significant die reduction and yield improvement in LSI implementation.

The branch metric processor of FIG. 3 is designed to receive three soft-decision symbols ($I_1$, $I_2$, $I_3$), three erase control signals ($E_1$, $E_2$, $E_3$), a quantization indicator (Q) and a base rate select signal and to produce at most 8 branch metrics (R0-R7). A set of three input registers 30, 32 and 34 receive symbols $I_1$, $I_2$ and $I_3$, respectively. An input register 36 receives a quantization indicator signal. Three input registers 38, 40 and 42 receive erase control signals $E_1$, $E_2$ and $E_3$, respectively. Input registers 30, 32, 34, 36, 38, 40 and 42 are coupled to a clock signal so as to synchronize the input of data to the processor.

Since the soft-decision symbols may be one, two or three bit words, depending on the level of quantization, it is advantageous to provide adjustment internal to the processor. To this end, input registers 30, 32 and 34 are coupled to shift down circuits 44, 46 and 48, respectively. In addition, shift down circuits 44, 46 and 48 are each coupled to input register 36. If the level of quantization chosen is 2 (that is, each soft-decision symbol is one bit), then each symbol will enter the proper shift down circuit on the most significant bit (MSB) line and two shifts will occur, placing the symbol bit on the least significant bit (LSB) line and placing 0's on the other two lines. In other words, a one or two bit word is turned into the equivalent three bit word. As is apparent, this internal adjustment may be eliminated by requiring different pin connections to the input registers for the different levels of quantization.

Input register 36, which receives a quantization indicator Q, is coupled to Q-to-N lookup table 50 which produces a signal N equal to the number of levels of quantization minus one. For instance, if the soft-decision symbols are two bit words the number of quantization levels is four and N is equal to three.

The first stage in the calculation of the branch metrics involves producing two sets of signals to be operated on by the remainder of the processor. The first set contains three signals equal to $N-I_1$, $N-I_2$ and $N-I_3$, respectively. The second set contains three signals equal to $I_1$, $I_2$ and $I_3$, respectively. In addition, any needed erasures take place at this stage. For instance, if erase control signal $E_2$ is equal to 1 the second signals in each of the two sets are set equal to 0, thus removing symbol $I_2$ from further processing. To implement this first stage, three summing circuits 52, 54 and 56 each have noninverted inputs coupled to the output of lookup table 50 and inverted inputs coupled to the outputs of shift down circuits 44, 46 and 48, respectively. A first double-pole, double-throw switch 58 has a first position in which a first output terminal 60 is coupled to the output of summing circuit 52 and a second output terminal 62 is coupled to the output of shift down circuit 44 and a second position in which both output terminals 60 and 62 are coupled to signals equal to 0. DPDT switch 58 is coupled to input register 38 whereby erase control signal $E_1$ determines the position of switch 58. A second DPDT switch 64 has a first position in which output terminal 66 is coupled to an output of summing circuit 54 and an output terminal 68 is coupled to the output of shift down circuit 46 and a second position in which both output terminals 66 and 68 are coupled to signals equal to 0. DPDT switch 64 is coupled to input register 40 whereby its position is determined by erase control signal $E_2$. Similarly, a third DPDT switch 70 has a first position in which output terminal 72 is coupled to an output of summing circuit 56 and output terminal 74 is coupled to the output of shift down circuit 48 and a second position in which both output terminal 72 and 74 are coupled to signals equal to 0. DPDT switch 70 is coupled to input register 42 whereby its position is determined by erase control signal $E_3$. As is apparent, the first set of signals described above appear at output terminals 60, 66 and 72, respectively and the second set of signals described above appear at output terminals 62, 68 and 74, respectively.

The remainder of the branch metric processor comprises a plurality of summing circuits interconnected so as to provide a set of sums and output registers for outputting the proper branch metrics. Each of the sums in the set is the sum of three addends chosen from the first and second sets of signals produced by the first stage. The set includes all of the possible combinations, but excludes redundant combinations and combinations including a signal from the first set, say $N-I_2$, and the corresponding signal from the second set, $I_2$. In other words, the set of sums includes all possible combinations formed by choosing one of the outputs of switch 58, one of the outputs of switch 64 and one of the outputs of switch 70. Since erasure of a particular symbol has been accomplished by setting the appropriate signals in the first and second sets equal to 0 no further adjustment is needed to compensate for erased symbols.

The second stage of the processor comprises four summing circuits 76, 78, 80 and 82. Summing circuit 76 has an input coupled to output terminal 62 of switch 58 and an input coupled to output terminal 66 of switch 64. Summing circuit 78 has an input coupled to output terminal 62 of switch 58 and an input coupled to output terminal 68 of switch 64. Summing circuit 80 has an input coupled to output terminal 68 of switch 64 and an input coupled to output terminal 60 of switch 58. Summing circuit 82 has an input coupled to output terminal 66 of switch 64 and an input coupled to output terminal 60 of switch 58. Therefore, the output of the second stage comprises all of the possible combinations of two signals with one chosen from switch 58 and one chosen from switch 64. The third stage of the processor comprises eight summing circuits 84, 86, 88, 90, 92, 94, 96 and 98. Summing circuit 84 has an input coupled to an output of summing circuit 76 and an input coupled to output terminal 72 of switch 70. Summing circuit 86 has an input coupled to an output of summing circuit 78 and an input coupled to output terminal 72 of switch 70. Summing circuit 88 has an input coupled to an output of summing circuit 80 and an input coupled to output terminal 72 of switch 70. Summing circuit 90 has an input coupled to an output of summing circuit 82 and an input coupled to output terminal 72 of switch 70. Summing circuit 92 has an input coupled to an output of summing circuit 76 and an input coupled to output terminal 74 of switch 70. Summing circuit 94 has an input coupled to an output of summing circuit 78 and an input coupled to output terminal 74 of switch 70. Summing circuit 96 has an input coupled to an output of summing circuit 80 and an input coupled to output terminal 74 of switch 70. Summing circuit 98 has an input coupled to an output of summing circuit 82 and an input coupled to output terminal 74 of switch 70. Therefore, the output of the third stage of the processor is the set of sums described above.

The output stage of the processor comprises a set of four output registers 100, 102, 104 and 106 and a set of four multiplexers 108, 110, 112 and 114, each coupled to a clock signal to synchronize the output. Output register 100 has an input coupled to an output of summing circuit 90. Output register 102 has an input coupled to an output of summing circuit 92. Output register 104 has an input coupled to an output of summing circuit 94. Output register 106 has an input coupled to an output of summing circuit 88. Multiplexer 108 has an A input coupled to an output of summing circuit 84, a B input coupled to an output of summing circuit 90 and a select input coupled to a select A/B control signal. Multiplexer 110 has an A input coupled to an output of summing circuit 86, a B input coupled to an output of summing circuit 88 and a select input coupled to the select A/B control signal. Multiplexer 112 has an A input coupled to an output of summing circuit 96, a B input coupled to an output of summing circuit 94, and a select input coupled to the select A/B control signal. Multiplexer 114 has an A input coupled to an output of summing circuit 98, a B input coupled to an output of summing circuit 92 and a select input coupled to the select A/B control signal. When the select A/B control signal is set to A the processor is in a rate ⅓ mode and the branch metrics are output as labeled in FIG. 3. Table I below contains the output of the branch metric processor of FIG. 3 when operating in a rate ⅓ mode showing the effects of the various possible combinations of erase control signals $E_1$, $E_2$ and $E_3$.

When the select A/B signal is set to B, the processor is in a rate ½ mode. Since only two symbols are received when operating at ½, one of the erase control signals, say $E_3$, is always set to 1. In that case, multiplexer 112 will output branch metric R0, multiplexer 114 will output branch metric R1, multiplexer 110 will output branch metric R2 and multiplexer 108 will output branch metric R3. If the branch metric processor of FIG. 3 is to be used in a multi-rate MCD, the fact that the branch metrics carried by various output lines changes as the rate changes must be accounted for by placing a multiplexer between the branch metric processor and the state metric processor to maintain the proper interconnection therebetween.

The ability of the processor described above to erase certain symbols allows rates other than the base code rates of ⅓ and ½ to be accommodated. For instance, if a rate 2/5 encoder is being used (5 symbols for every 2 data bits), the proper branch metrics may be generated by setting the processor to rate ⅓ (6 symbols for every 2 data bits) and erasing one symbol, say $I_3$, on alternate cycles of the processor. Furthermore, the reduced complexity structure exhibited in FIG. 3 may be expanded so as to allow for much lower base rates, say 1/10. Such low code rates are useful in low signal to noise ratio applications such as deep space communications for anti-jamming systems. In such applications, it may be advantageous to reject a received symbol because of a suspected noise spike or jamming signal, in which case the branch metric processor described can simply be instructed to erase that symbol.

TABLE I

| BRANCH METRIC | $E_1$ $E_2$ $E_3$ 000 | 001 | 010 | 011 | 100 | 101 | 110 | 111 |
|---|---|---|---|---|---|---|---|---|
| $R_0$ | $I_1 + I_2 + I_3$ | $I_1 + I_2$ | $I_1 + I_3$ | $I_1$ | $I_2 + I_3$ | $I_2$ | $I_3$ | 0 |
| $R_1$ | $N + I_1 + I_2 - I_3$ | $I_1 + I_2$ | $N + I_1 - I_3$ | $I_1$ | $N + I_2 - I_3$ | $I_2$ | $N - I_3$ | 0 |
| $R_2$ | $N + I_1 - I_2 + I_3$ | $N + I_1 - I_2$ | $I_1 + I_3$ | $I_1$ | $N - I_2 + I_3$ | $N - I_2$ | $I_3$ | 0 |
| $R_3$ | $2N + I_1 - I_2 - I_3$ | $N + I_1 - I_2$ | $N + I_1 - I_3$ | $I_1$ | $2N - I_2 - I_3$ | $N - I_2$ | $N - I_3$ | 0 |
| $R_4$ | $N - I_1 + I_2 + I_3$ | $N - I_1 + I_2$ | $N - I_1 + I_3$ | $N - I_1$ | $I_2 + I_3$ | $I_2$ | $I_3$ | 0 |
| $R_5$ | $2N_1 - I_1 + I_2 - I_3$ | $N - I_1 + I_2$ | $2N - I_1 - I_3$ | $N - I_1$ | $N + I_2 - I_3$ | $I_2$ | $N - I_3$ | 0 |
| $R_6$ | $2N - I_1 - I_2 + I_3$ | $2N - I_1 - I_2$ | $N - I_1 + I_3$ | $N - I_1$ | $N - I_2 + I_3$ | $N - I_2$ | $I_3$ | 0 |
| $R_7$ | $3N - I_1 - I_2 - I_3$ | $2N - I_1 - I_2$ | $2N - I_1 - I_3$ | $N - I_1$ | $2N - I_2 - I_3$ | $N - I_2$ | $N - I_3$ | 0 |

BRANCH METRIC PROCESSOR OUTPUT - RATE ⅓

A branch metric processor is disclosed herein which offers substantial advantages due to reduced complexity in both discrete and LSI implementations. In addition, it is adaptable to different levels of quantization and different code rates which obviates the need for special processors and even allows multi-rate maximum likelihood convolutional decoders to be implemented. While the invention has been particularly shown and described with reference to a preferred embodiment thereof, it will be understood by those skilled in the art that various other modifications and changes may be made to the present invention without departing from the spirit and scope thereof.

We claim:

1. In a maximum-likelihood convolutional decoder, a branch metric processor comprising:
   first input means for receiving a predetermined number of symbols and an indication of a level of quantization thereof;
   second input means for receiving at least one erase control signal;
   calculation means coupled to said first and second input means for operating on said symbols and level of quantization, said calculation means being responsive to said at least one erase control signal to erase at least one of said symbols, said calculation means also being responsive to a select control signal to produce branch metrics corresponding to a selected one of at least two base code rates.

2. A branch metric processor according to claim 1 wherein a first stage of said calculation means comprises:
   circuit means coupled to said first and second input means for producing a first set of signals and a second set of signals, each of said first and second sets of signals having a number of signals equal to said number of symbols, each of said signals in said first set being equal to a difference between said level of quantization minus one and one of said symbols, each of said signals in said second set being equal to one of said symbols, said circuit means being responsive to said at least one erase control signal to set at least one signal in said first set and at least one corresponding signal in said second set equal to zero.

3. A branch metric processor according to claim 2 wherein said calculation means further comprises:
   summation means coupled to said first stage for producing a set of sums, each of said sums having a number of addends equal to said number of symbols, said set of sums including all of the possible combinations of said signals in said first and second sets but excluding redundant combinations and combinations including a signal from said first set and the corresponding signal from said second set; and
   output means coupled to said summation means for outputing said set of sums, said output means being responsive to said select control signal to select one of said at least two base code rates.

4. A branch metric processor according to claim 1 further comprising:
   shift means coupled between said first input means and said calculation means for adjusting said symbols responsive to said indication of said level of quantization thereof.

5. A branch metric processor according to claim 2 wherein said circuit means comprises:
   a number of summing circuits equal to said number of symbols, each of said summing circuits having a non-inverted input equal to said level of quantization minus one and an inverted input equal to one of said symbols; and
   at least one double-pole, double-throw switch having a first position in which a first output is equal to an output of one of said summing circuits and a second output is equal to the symbol at said inverted input of the same summing circuit and a second position in which both outputs are equal to zero, the position of each of said switches being determined by one of said at least one erase control signals.

6. In a maximum-likelihood convolutional decoder, a branch metric processor for generating branch metrics corresponding to base code rates of 1/X and 1/Y, where X>Y, comprising:
   a first set of input registers comprising X registers each adapted to receive a soft-decision symbol;
   a quantization input register adapted to receive an indication of a level of quantization of said symbols;
   a second set of input registers comprising X registers each adapted to receive an erase control signal, each of said registers in said second set being associated with a register in said first set;
   means coupled to said quantization input register for producing a signal N equal to said level of quantization minus one;
   a set of X subtraction circuits each coupled to one of said first set of input registers and to said signal N to produce a signal equal to N minus said symbol received by said one of said input registers;
   a set of X switches having first and second outputs, each of said switches having a first position in which said first output is coupled to one of said subtraction circuits and said second output is coupled to the input register coupled to said one of said subtraction circuits and a second position in which each of said first and second outputs is equal to zero, each of said switches being coupled to said input register in said second set which is associated with the input register coupled to said one of said subtraction circuits, whereby the erase control signal received by said input register determines the position of the switch;
   summation means coupled to said outputs of said switches for producing a set of sums, each of said sums having a number of addends equal to X, said set of sums including all possible combinations of said outputs but excluding redundant combinations and combinations including two outputs from any one of said switches; and
   output means coupled to said summation means for outputing said sums as branch metrics, said output means being responsive to a select control signal to select the proper of said sums to correspond to one of said base code rates.

7. A branch metric processor according to claim 6 further comprising:
   shift means coupled between said first set of input registers and said subtraction circuits for adjusting said received symbols in response to said indication of said level of quantization thereof.

8. In a maximum-likelihood convolutional decoder a method of branch metric processing comprising the steps of:
   receiving a set of soft-decision symbols and an indication of a level of quantization thereof;
   receiving at least one erase control signal;
   producing a first set of signals each of which is equal to said level of quantization minus one minus one of said symbols;
   producing a second set of signals each of which is equal to one of said symbols;
   responding to said at least one erase control signal by setting an indicated signal in said first set and a corresponding signal in said second set equal to zero;

producing a set of sums each of which has a number of addends equal to a number of said received symbols, said set including all possible combinations of signals from said first and second sets, but excluding redundant combinations and combinations including a signal from said first set and the corresponding signal from said second set; and receiving and responding to a base rate select signal by outputting said sums as branch metrics for a selected one of at least two base code rates.

* * * * *